US012611694B2

(12) United States Patent
Wang et al.

(10) Patent No.: US 12,611,694 B2
(45) Date of Patent: *Apr. 28, 2026

(54) METHOD OF OPERATING DRIPPAGE PREVENTION SYSTEM

(71) Applicant: TAIWAN SEMICONDUCTOR MANUFACTURING COMPANY, LTD., Hsinchu (TW)

(72) Inventors: Chien-Hung Wang, Toufen Township (TW); Chun-Chih Lin, Taipei City (TW); Chi-Hung Liao, Sanchong City (TW); Yung-Yao Lee, Zhubei City (TW); Wei Chang Cheng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/756,153

(22) Filed: Jun. 27, 2024

(65) Prior Publication Data

US 2024/0342745 A1 Oct. 17, 2024

Related U.S. Application Data

(60) Continuation of application No. 17/062,977, filed on Oct. 5, 2020, now Pat. No. 12,048,944, which is a
(Continued)

(51) Int. Cl.
*B05C 11/10* (2006.01)
*F16K 7/12* (2006.01)
(Continued)

(52) U.S. Cl.
CPC .......... *B05C 11/1002* (2013.01); *F16K 7/126* (2013.01); *F16K 23/00* (2013.01);
(Continued)

(58) Field of Classification Search
CPC ....... B05C 11/1002; B05C 5/02; B05C 11/08; F16K 7/126; F16K 23/00; F16K 31/1221;
(Continued)

(56) References Cited

U.S. PATENT DOCUMENTS 3,537,475 A * 11/1970 Pottinger .............. F16K 31/404
137/881
4,519,526 A 5/1985 Hillman
(Continued)

FOREIGN PATENT DOCUMENTS

EP 0235766 9/1987
EP 0235766 A2 * 9/1987
(Continued)

*Primary Examiner* — Bob Zadeh
(74) *Attorney, Agent, or Firm* — Hauptman Ham, LLP

(57) ABSTRACT

A method of preventing drippage in a liquid dispensing system includes generating at least a first proxy signal representing at least a first indirect measure of a position of a first automatic control valve (ACV), wherein the first ACV has positions ranging from fully closed to fully open. The method further includes recognizing, based on at least the first proxy signal, whether a failure state exists in which the first ACV has failed to close. The method further includes causing a second ACV to close when the failure state exists, wherein the second ACV is fluidically connected to the first ACV, and the second ACV has positions ranging from fully closed to fully open.

20 Claims, 13 Drawing Sheets

Related U.S. Application Data division of application No. 15/597,908, filed on May 17, 2017, now Pat. No. 10,792,697.

(51) Int. Cl.

| | |
|---|---|
| *F16K 23/00* | (2006.01) |
| *F16K 31/122* | (2006.01) |
| *F16K 37/00* | (2006.01) |
| *H01L 21/67* | (2006.01) |
| *B05C 5/02* | (2006.01) |
| *B05C 11/08* | (2006.01) |
| *G03F 7/16* | (2006.01) |
| *G03F 7/30* | (2006.01) |

(52) U.S. Cl.

CPC ...... *F16K 31/1221* (2013.01); *F16K 37/0041* (2013.01); *H01L 21/67017* (2013.01); *H01L 21/6715* (2013.01); *B05C 5/02* (2013.01); *B05C 11/08* (2013.01); *G03F 7/162* (2013.01); *G03F 7/3021* (2013.01)

(58) Field of Classification Search

CPC .. F16K 37/0041; F16K 7/123; F16K 37/0091; H01L 21/67017; H01L 21/6715; G03F 7/162; G03F 7/3021

See application file for complete search history.

(56) References Cited

U.S. PATENT DOCUMENTS

| | | | | |
|---|---|---|---|---|
| 4,719,362 | A | | 1/1988 | Nest et al. |
| 4,842,162 | A | * | 6/1989 | Merkel ................ B05C 5/0225 |
| | | | | 239/533.1 |
| 4,971,012 | A | * | 11/1990 | Brunnel ............. F02M 63/0215 |
| | | | | 123/387 |
| 5,251,148 | A | | 10/1993 | Haines et al. |
| 5,264,733 | A | | 11/1993 | Tigges |
| 5,549,137 | A | | 8/1996 | Lenz et al. |
| 5,558,115 | A | | 9/1996 | Lenz et al. |
| 5,934,302 | A | | 8/1999 | Nemelka |
| 5,985,357 | A | | 11/1999 | Sanada |
| 6,817,486 | B2 | | 11/2004 | Yang et al. |
| 6,857,543 | B2 | | 2/2005 | Kvam et al. |
| 7,066,203 | B2 | | 6/2006 | Baarda |
| 8,020,585 | B2 | | 9/2011 | Shock et al. |
| 8,469,285 | B2 | | 6/2013 | Nakashima et al. |
| 9,372,405 | B2 | | 6/2016 | Furusho et al. |
| 10,792,697 | B2 | * | 10/2020 | Wang .................. F16K 37/0041 |
| 12,048,944 | B2 | * | 7/2024 | Wang .................. F16K 37/0041 |
| 2002/0029740 | A1 | | 3/2002 | McLoughlin et al. |
| 2003/0180444 | A1 | | 9/2003 | Takekuma et al. |
| 2003/0230288 | A1 | * | 12/2003 | King ..................... F02M 37/20 |
| | | | | 123/516 |
| 2006/0086065 | A1 | * | 4/2006 | Tomalesky ........... B67B 3/2053 |
| | | | | 53/425 |
| 2007/0251450 | A1 | | 11/2007 | Lin |
| 2008/0264498 | A1 | | 10/2008 | Thompson et al. |
| 2010/0043896 | A1 | * | 2/2010 | Shock ................. G01M 3/2876 |
| | | | | 137/613 |
| 2010/0125424 | A1 | | 5/2010 | Ding et al. |
| 2011/0008964 | A1 | | 1/2011 | Hughes |
| 2011/0114665 | A1 | * | 5/2011 | Chandler .............. C23C 16/047 |
| | | | | 118/726 |
| 2011/0240157 | A1 | * | 10/2011 | Jones ........................ F17D 1/20 |
| | | | | 137/613 |
| 2011/0292139 | A1 | | 12/2011 | Ito |
| 2014/0027535 | A1 | | 1/2014 | Pan |
| 2015/0004720 | A1 | | 1/2015 | Liu |
| 2015/0149100 | A1 | * | 5/2015 | Eisenbeis ........... F16K 37/0041 |
| | | | | 702/58 |
| 2017/0067578 | A1 | * | 3/2017 | Hoffman ............. G01M 3/2876 |
| 2017/0107982 | A1 | | 4/2017 | Cedrone et al. |
| 2017/0278696 | A1 | | 9/2017 | Imamura et al. |
| 2024/0342745 | A1 | * | 10/2024 | Wang .................. F16K 31/1221 |

FOREIGN PATENT DOCUMENTS

| | | | | |
|---|---|---|---|---|
| JP | 2006026313 | A | * | 2/2006 |
| JP | 4917796 | B2 | * | 4/2012 |

* cited by examiner

502

504
generate at least first proxy signal representing indirect measure of position of first ACV 506
recognize, based on at least first proxy signal, that first ACV has failed to close (thus failure state exists)

508
cause second ACV to close

<u>506</u>
recognize that first
ACV failed to close

<u>520</u>
determine difference between the proxy signal
and reference value

<u>522</u>
compare difference against deviation threshold

<u>524</u>
deem that failure state exists when difference
exceeds deviation threshold

656

METHOD OF OPERATING DRIPPAGE PREVENTION SYSTEM

PRIORITY CLAIM

This application is a continuation of U.S. application Ser. No. 17/062,977, filed Oct. 5, 2022, now U.S. Pat. No. 12,048,944, issued Jun. 30, 2024, which is a divisional application of U.S. application Ser. No. 15/597,908, filed on May 17, 2017, now U.S. Pat. No. 10,792,697, issued Oct. 6, 2020, all contents of which are hereby incorporated by reference.

BACKGROUND

During fabrication, a semiconductor wafer is subjected to multiple processes in order to produce, eventually, multiple ICs from the wafer. Such multiple processes include deposition processes in which corresponding layers of material are deposited onto the surface of the wafer.

In a typical deposition process, a layer of photoresist material, such as a tri-layer photoresist, is applied to the semiconductor substrate. Before such a deposition process, the surface of the wafer is subjected to a substrate-preparation process in order to prepare the surface of the wafer to receive the photoresist. A substrate-preparation process typically includes washing the surface of the wafer with a cleaning solvent, then baking the wafer to promote dehydration, and then spin-coating an adhesion promoter onto the wafer. Subsequently, the layer of photoresist material is spin-coated onto the wafer. The layer of photoresist material is exposed to light (or other types of exposing radiation) in order to selectively change the solubility of the resist to a developer. After exposure, developer is applied to the layer of now-exposed photoresist material, e.g., by releasing the developer onto the wafer as the wafer is spun (spin-releasing).

Each of the washing, the spin-coating of the adhesion promoter, the spin-coating of the photoresist material and the spin-releasing of the developer includes dispensing a liquid. Typically, an automatic control valve (ACV) such as a pneumatically-actuated valve is used to start and stop the flow of the liquid material onto the surface of the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
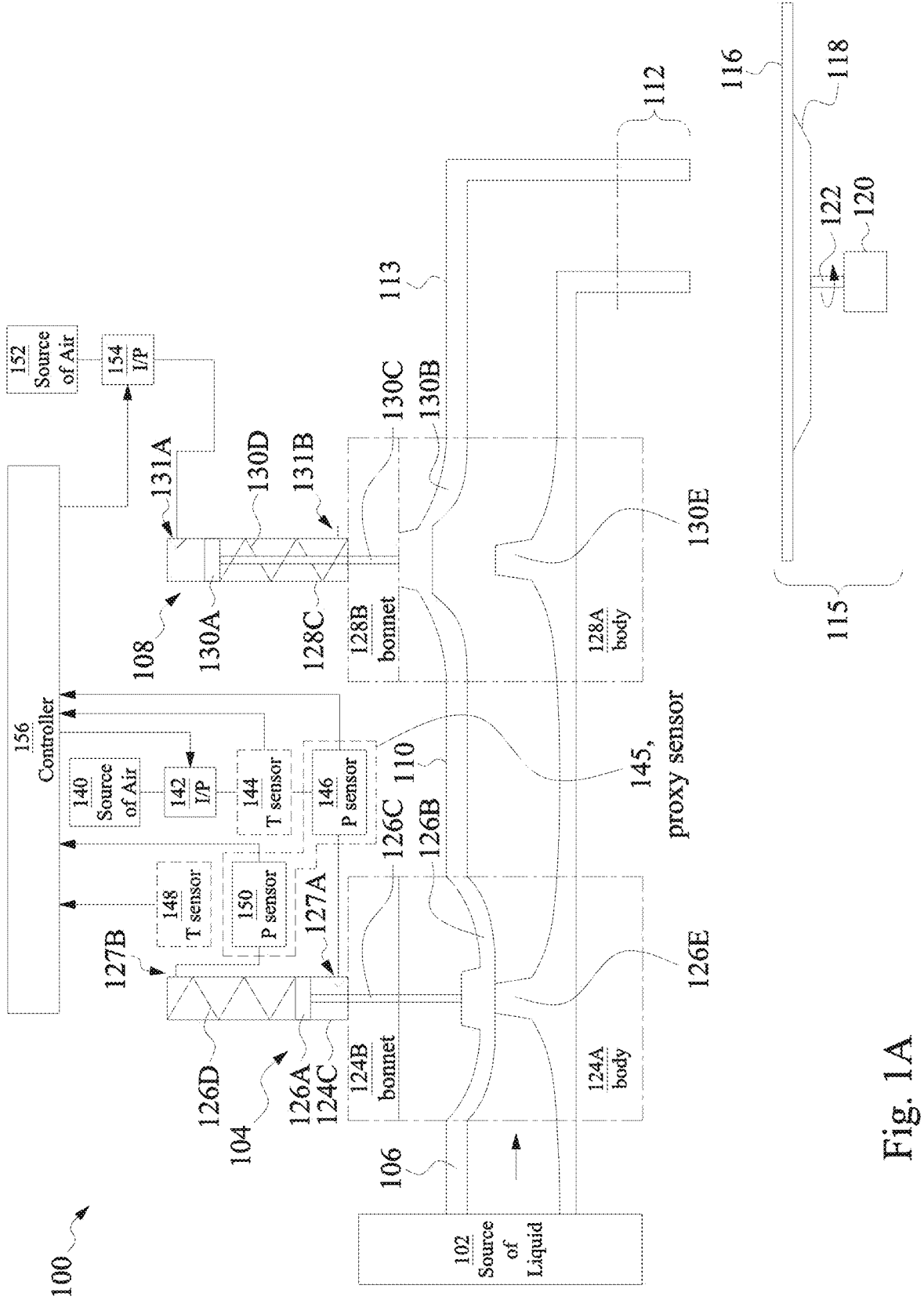
FIGS. 1A-1D are diagrams of a drippage prevention system, in accordance with at least one embodiment of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the context of integrated circuit (IC) fabrication, a semiconductor wafer is subjected to multiple processes including deposition processes. For a typical deposition process, each of the washing, the spin-coating of the adhesion promoter, the spin-coating of the photoresist material and the spin-releasing of the developer includes dispensing a liquid from a nozzle using a corresponding main automatic control valve (ACV), typically a pneumatically controlled ACV. If the main ACV does not fully close, then the flow of liquid is not stopped, e.g., resulting in drippage, where drippage is understood to mean drops of the liquid continuing to reach the wafer. Drippage associated with one or more of the multiple processes (to which the semiconductor wafer is subjected) would reduce the quality of the ICs which ultimately result from having performed the multiple processes on the wafer. At least some embodiments of the present disclosure prevent drippage by providing a liquid dispensing system including: a main ACV retrofitted with a proxy sensor; and a backup ACV fluidically connected between the main ACV and the nozzle. The proxy sensor generates a proxy signal representing an indirect measure of a position of the first ACV. A controller causes the backup ACV to close based on the proxy signal.

FIGS. 1A-1D are diagrams of a drippage prevention system 100, in accordance with at least one embodiment of the present disclosure.

System 100 includes: a source 102 of a fluid, e.g., a liquid (liquid-source 102), which is to be dispensed; a main automatic control valve (ACV) 104; a fluidic connection, e.g., a pipe 106, which fluidically connects liquid-source 102 to main ACV 104; a backup ACV 108; a fluidic connection, e.g., a pipe 110, which fluidically connects main ACV 104 to backup ACV 108; a nozzle 112 from which the fluid/liquid is dispensed; a fluidic connection, e.g., a pipe 113, which fluidically connects backup ACV 108 to nozzle 112; and a wafer-spinning arrangement 115.

Main ACV 104 is a pneumatically actuated ACV. Main ACV 104 includes: a body 124A; a bonnet 124B mechanically connected to body 124A; a cylinder 124C mechanically connected to bonnet 124B; an axially-movable piston 126A in cylinder 124C; a diaphragm 126B in body 124A; a stem 126C mechanically connecting piston 126A to diaphragm 126B; a spring 126D arranged inside cylinder 124C and on a side of piston 126A opposite to stem 126C; and a weir 126E fixed in body 124A. A weir is a saddle or a seat against which a pinch-portion of diaphragm 126B can be brought into contact. Cylinder 124C has two pneumatic ports: a first pneumatic port 127A, which is located on the side of piston 126A opposite to the side on which spring 126D is located; and a second pneumatic port 127B, which is located on the same side of piston 126A as spring 126D.

Backup ACV 108 also is a pneumatically actuated ACV. Backup ACV 108 includes: a body 128A; a bonnet 128B mechanically connected to body 128A; a cylinder 128C mechanically connected to bonnet 128B; an axially-movable piston 130A in cylinder 128C; a diaphragm 130B in body 128A; a stem 130C mechanically connecting piston 130A to diaphragm 130B; a spring 130D arranged inside cylinder 128C and on the same side of piston 130A as stem 130C; and a weir 130E fixed in body 128A. Cylinder 128C includes two pneumatic ports: a first pneumatic port 131A, which is located on the side of piston 130A opposite to the side on which spring 130D is located; and a second pneumatic port 131B, which is located on the same side of piston 130A as spring 130D.

System 100 further includes: a first source 140 of air (air-source 140); a first current-to-pressure (I/P) converter 142; an optional first temperature sensor 144; a proxy sensor 145; an optional second temperature sensor 148; a second air-source 152; a second I/P converter 154; and a controller 156. Proxy sensor 145 is a pressure sensing arrangement which includes a first pressure sensor 146 and a second pressure sensor 150. In some embodiments, first air-source 140 and second air-source 152 are the same apparatus/device. In some embodiments, first I/P converter 142 and second I/P converter 154 are the same apparatus/device.

First I/P converter 142 is fluidically connected to first air-source 140. First temperature sensor 144 is fluidically connected to first I/P converter 142. First pressure sensor 146 of proxy sensor 145 is fluidically connected to first temperature sensor 144 and to first pneumatic port 127A of cylinder 124C. In some embodiments, first I/P converter 142 includes an air-release valve (not shown) by which air-pressure is controllably released from the overall/cumulative fluidic connection between first I/P converter 142 and first pneumatic port 127A of cylinder 124C. Second pressure sensor 150 of proxy sensor 145 is fluidically connected to second temperature sensor 148 and to second pneumatic port 127B of cylinder 124C. Second I/P converter 154 is fluidically connected to second air-source 152 and to second pneumatic port 127B of cylinder 124C. Details regarding I/P converters and arrangements including the same, in general, are found in U.S. Pat. No. 5,251,148, granted Oct. 5, 1993, and U.S. Pat. No. 5,558,115, granted Sep. 24, 1996, the entirety of each of which is hereby incorporated by reference.

Controller 156 is electrically connected to first I/P converter 142, first temperature sensor 144, first pressure sensor 146, second temperature sensor 148, second pressure sensor 150, and second I/P converter 154. Controller 156 receives: first and second pressure signals from corresponding first pressure sensor 146 and second pressure sensor 150 of proxy sensor 145; and first and second temperature signals from corresponding first temperature sensor 144 and second temperature sensor 148. The first pressure signal from first pressure sensor 146 represents pressure of air on the same side of piston 126A as first pneumatic port 127A of cylinder 124C. The second pressure signal from second pressure sensor 150 represents air pressure on the same side of piston 126A as second pneumatic port 127B of cylinder 124C. The first temperature signal from first temperature sensor 144 represents temperature of air on the same side of piston 126A as first pneumatic port 127A of cylinder 124C. The second temperature signal from second temperature sensor 148 represents temperature of air on the same side of piston 126A as second pneumatic port 127B of cylinder 124C.

Based on the process for which the liquid being sourced by liquid-source 102 is being used, controller 156 generates a first control signal and provides the first control signal to first I/P converter 142 in order to selectively open/close main ACV 104. Based on the first and second pressure signals and the first and second temperature signals, controller 156 generates a second control signal and provides the second control signal to second I/P converter 154 in order to selectively open/close backup ACV 108.

Figure 1B:
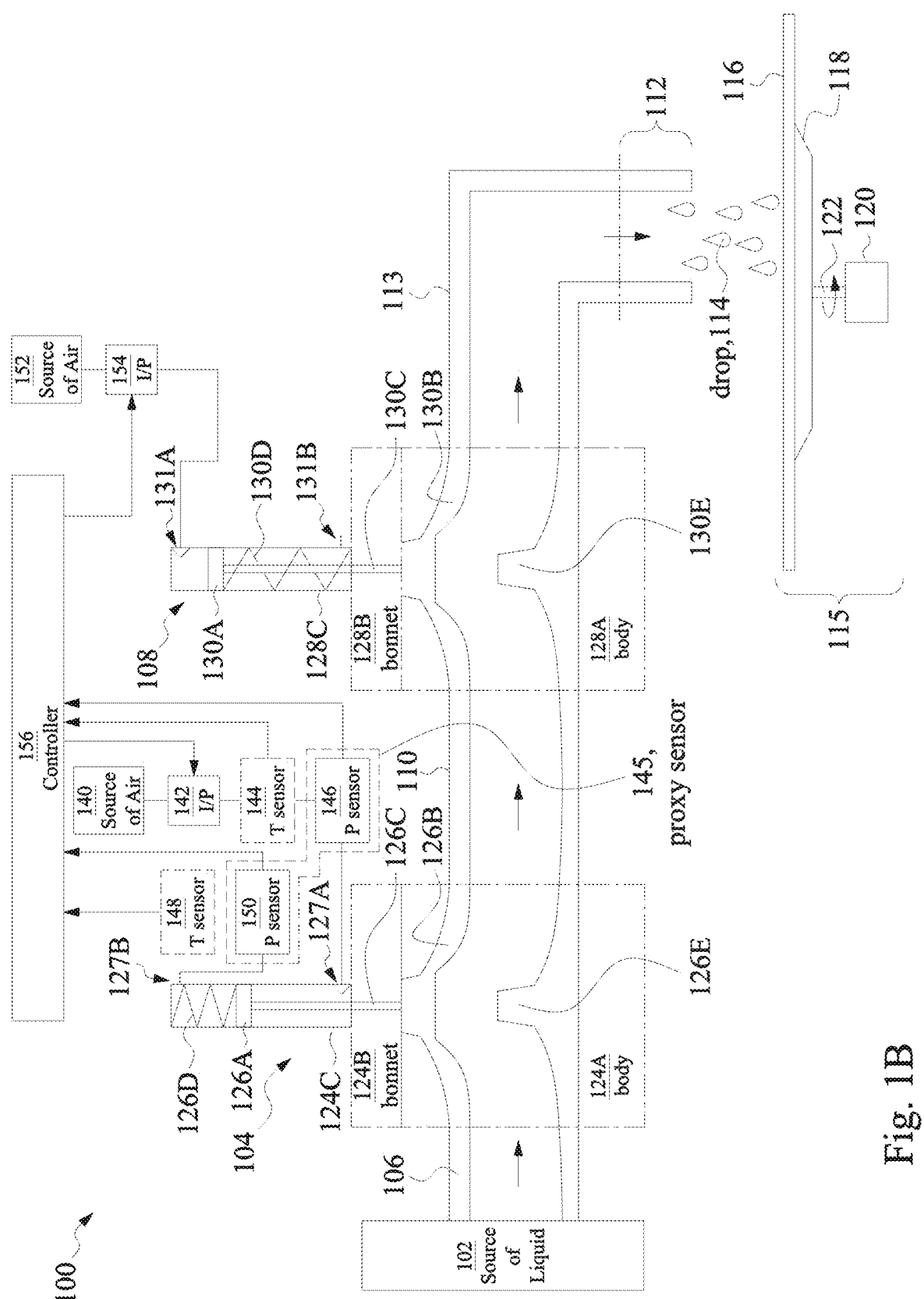

Diaphragm 126B (of body 124A of main ACV 104) is formed of a resilient material. In a closed position corresponding to a non-actuated (or default) state of main ACV 104 (which is shown in FIG. 1A), stem 126C forces a pinch-portion of diaphragm 126B into contact with weir 126E, thereby blocking the flow of liquid from pipe 106 to pipe 110. In an open position corresponding to an actuated state of main ACV 104 (which is shown in FIG. 1B), first I/P converter 142 (according to the first control signal from controller 156), provides air pressure to overcome the bias force on piston 126A (applied by spring 126D) and thereby move piston 126A away from weir 126E such that stem 126C pulls the pinch-portion of diaphragm 126B away from weir 126E, thereby unblocking the flow of liquid from pipe 106 to pipe 110. Main ACV 104 has been shown with weir configuration. In some embodiments, main ACV 104 has a straight-through configuration such there is no weir 126E.

Diaphragm 130B (of body 128A of backup ACV 108) is formed of a resilient material. In an open position corresponding to a non-actuated state of backup ACV 108 (which is shown in FIG. 1A), spring 130D has forced piston 130A away from weir 130E such that stem 130C pulls the pinch-portion of diaphragm 130B away from weir 130E, thereby unblocking the flow of liquid from pipe 110 to pipe 113. In a closed position corresponding to an actuated state of backup ACV 108 (which is shown in FIG. 1B), second I/P converter 154 (according to the second control signal from controller 156), provides air pressure to overcome the bias force on piston 130A (applied by spring 130D) and thereby moves piston 130A toward weir 130E such that stem 130C forces the pinch-portion of diaphragm 130B into contact with weir 130E, thereby blocking the flow of liquid from pipe 110 to pipe 113. Backup ACV 108 has been shown with weir configuration. In some embodiments, backup ACV 108 has a straight-through configuration such there is no weir 130E.

Wafer-spinning arrangement 115 includes: a semiconductor wafer 116; a rotatable table 118 on which wafer 116 is disposed; a motor 120; and a shaft 122 mechanically connecting rotatable table 118 to motor 120. In some embodiments, relative to a fixed position of nozzle 112, wafer-spinning arrangement 115 is moveable/translatable in at least two directions. In some embodiments, relative to a fixed position of wafer-spinning arrangement 115, nozzle 112 is moveable/translatable in at least two directions. In some embodiments, each of wafer-spinning arrangement 115 and nozzle 112 is moveable/translatable in at least two directions.

In FIG. 1A, controller 156 has controlled main ACV 104 to be in the closed position corresponding to the non-actuated state of main ACV 104 and has controlled backup ACV 108 to be in the open position corresponding to the non-actuated state of backup ACV 108. Because main ACV 104 is in the closed position, stem 126C forces the pinch-portion of diaphragm 126B into contact with weir 126E, thereby blocking the flow of liquid from pipe 106 to pipe 110, hence no drops of liquid are shown between nozzle 112 and wafer 116.

In FIG. 1B, controller 156 has controlled main ACV 104 to be in the open position corresponding to the actuated state of main ACV 104 and has controlled backup ACV 108 to be in the open position corresponding to the non-actuated state of backup ACV 108. Because main ACV is in the open position, stem 126C pulls the pinch-portion of diaphragm 126B away from weir 126E, thereby unblocking the flow of liquid from pipe 106 to pipe 110. Because backup ACV 108 is in the open position, stem 130C pulls a pinch-portion of diaphragm 130B away from weir 130E, thereby unblocking the flow of liquid from pipe 110 to pipe 113. As such, liquid is dispensed from nozzle 112, hence drops 114 of liquid are shown between nozzle 112 and wafer 116.

Figure 1C:
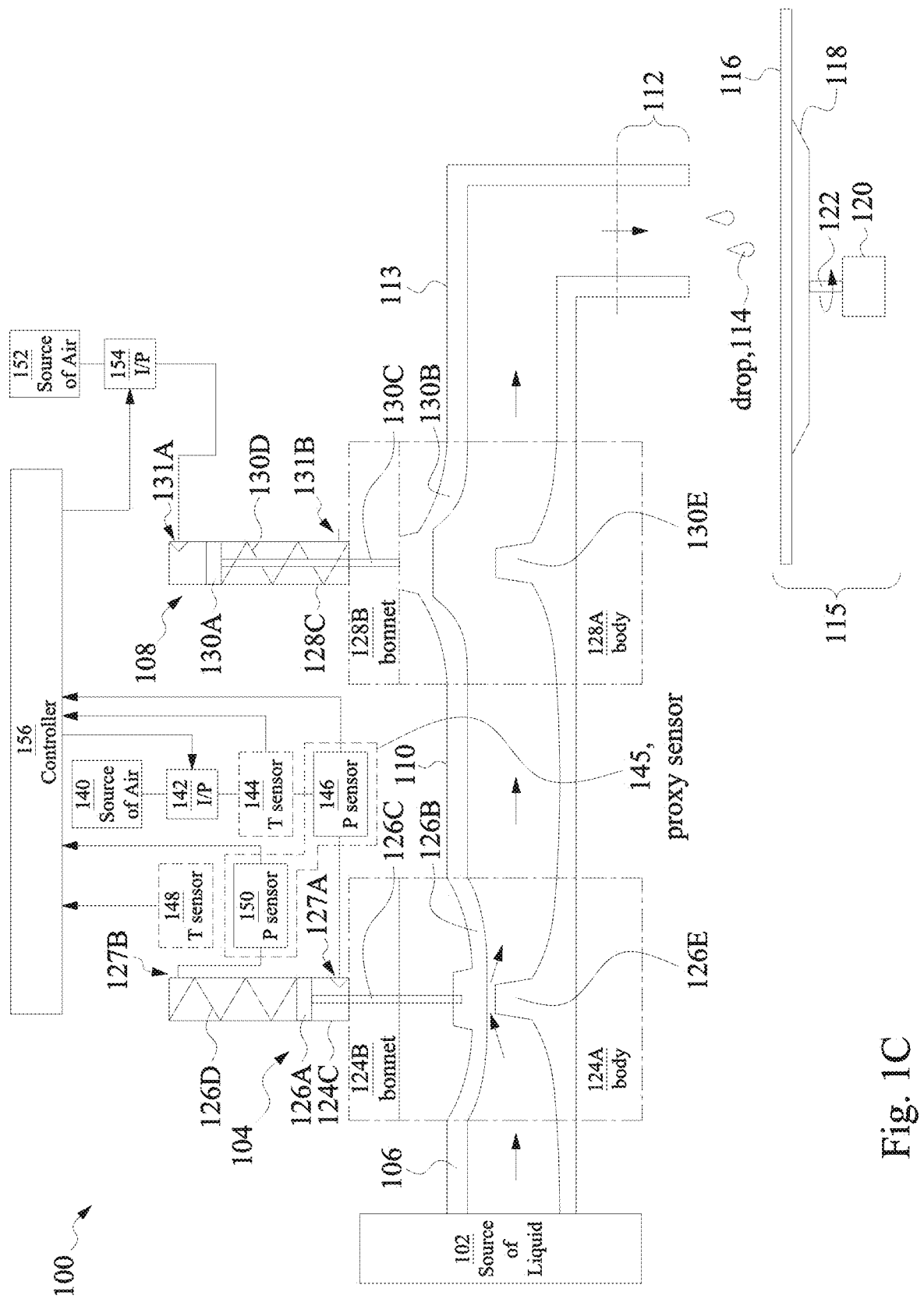

In FIG. 1C, controller 156 has attempted to control main ACV 104 to be in the closed position corresponding to the non-actuated state of main ACV 104 and has controlled backup ACV 108 to be in the open position corresponding to the non-actuated state of backup ACV 108. For a variety of reasons, main ACV 104 may not fully close, as is shown in FIG. 1C. Possible reasons include generation of an insufficient biasing force by spring 126D due to aging, increased friction between the circumferential face of piston 126A and the walls of cylinder 124C of main ACV 104, or the like. Because main ACV 104 is not fully closed, stem 126C does not force the pinch-portion of diaphragm 126B into contact with weir 126E, thereby permitting a small flow of liquid to pass from pipe 106 to pipe 110. The small flow of liquid is less than when the main ACV 104 is in a full open position and more than when the main ACV 104 is in a fully closed position. Because backup ACV 108 is in the open position, the small flow of liquid passes from pipe 110 to pipe 113, hence drops 114 of liquid are shown between nozzle 112 and wafer 116. Because FIG. 1C concerns a smaller flow of liquid than FIG. 1B, fewer drops 114 are shown in FIG. 1C than are shown in FIG. 1B.

Figure 1D:
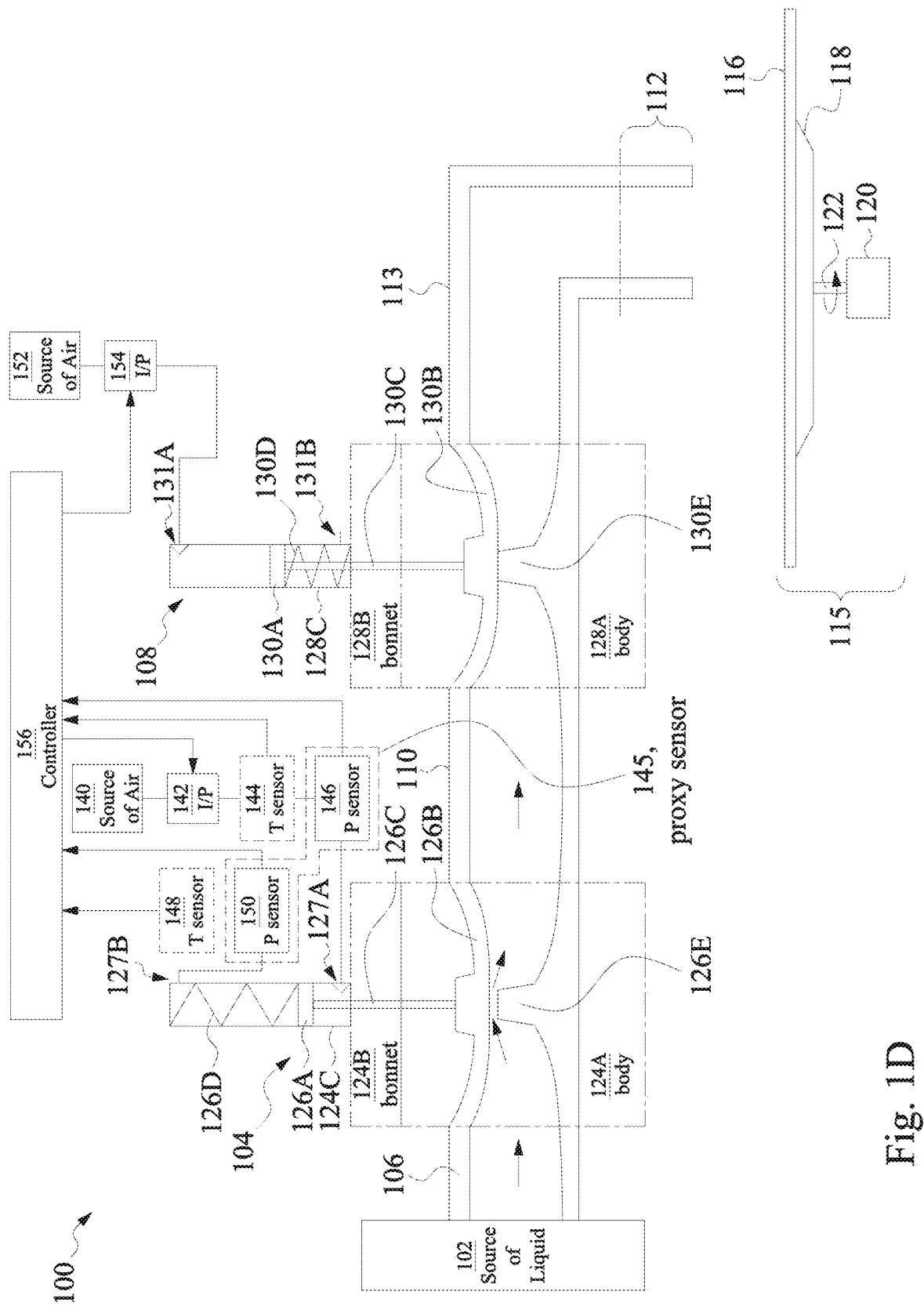

In FIG. 1D, controller 156 has attempted to control main ACV 104 to be in the closed position corresponding to the non-actuated state of main ACV 104 and has controlled backup ACV 108 to be in the closed position corresponding to the actuated state of backup ACV 108. Further, in FIG. 1D, main ACV 104 has not fully closed. As noted, for a variety of reasons, main ACV 104 may not full close, as is shown in FIG. 1D. Based on the first and second pressure signals and the first and second temperature signals, controller 156 has recognized that main ACV 104 has not fully closed, and accordingly has controlled backup ACV 108 to be in the closed position. Because backup ACV 108 is in the closed position, stem 130C forces the pinch-portion of diaphragm 130B into contact with weir 130E, thereby blocking the flow of liquid from pipe 110 to pipe 113, hence no drops of liquid are shown between nozzle 112 and wafer 116.

In contrast to another sensing arrangement which would directly measure a position of the pinch-portion of diaphragm 126B relative to weir 126E, proxy sensor 145, and more particularly each of first pressure sensor 146 and second pressure sensor 150, measures a corresponding parameter (namely, pressure) which is indirectly reflective of the position of the pinch-portion of diaphragm 126B. As such, each of first and second pressure signals from corresponding first pressure sensor 146 and second pressure sensor 150 is described as a proxy (or substitute) for a directly measured position of the pinch-portion of diaphragm 126B. Together, first pressure sensor 146 and second pressure sensor 150 together comprise proxy sensor 145, where proxy sensor 145 is a retrofit substitute for a sensor which otherwise would directly measure the position of the pinch-portion of diaphragm 126B relative to weir 126E.

Figure 1E:
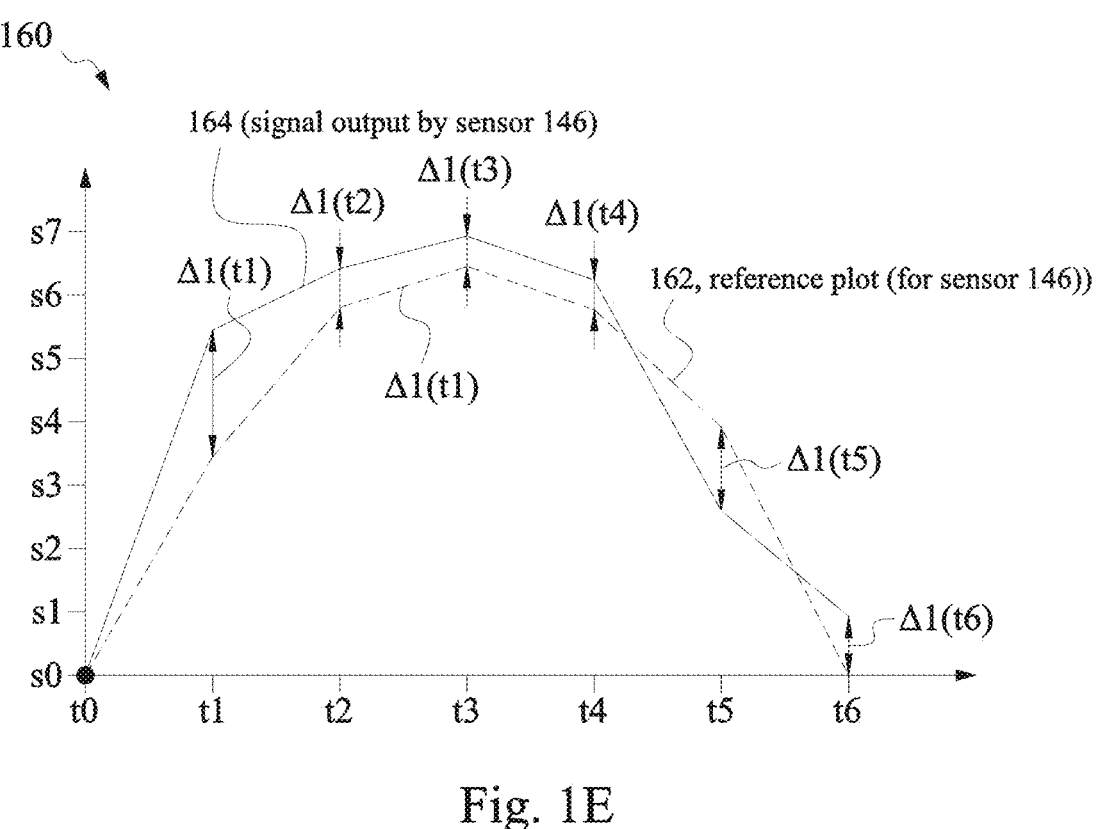
FIGS. 1E-1F are pressure-plots (plots of pressures) corresponding to the first pressure sensor and the second pressure sensor in FIGS. 1A-1D, in accordance with at least one embodiment of the present disclosure.
Figure 1F:
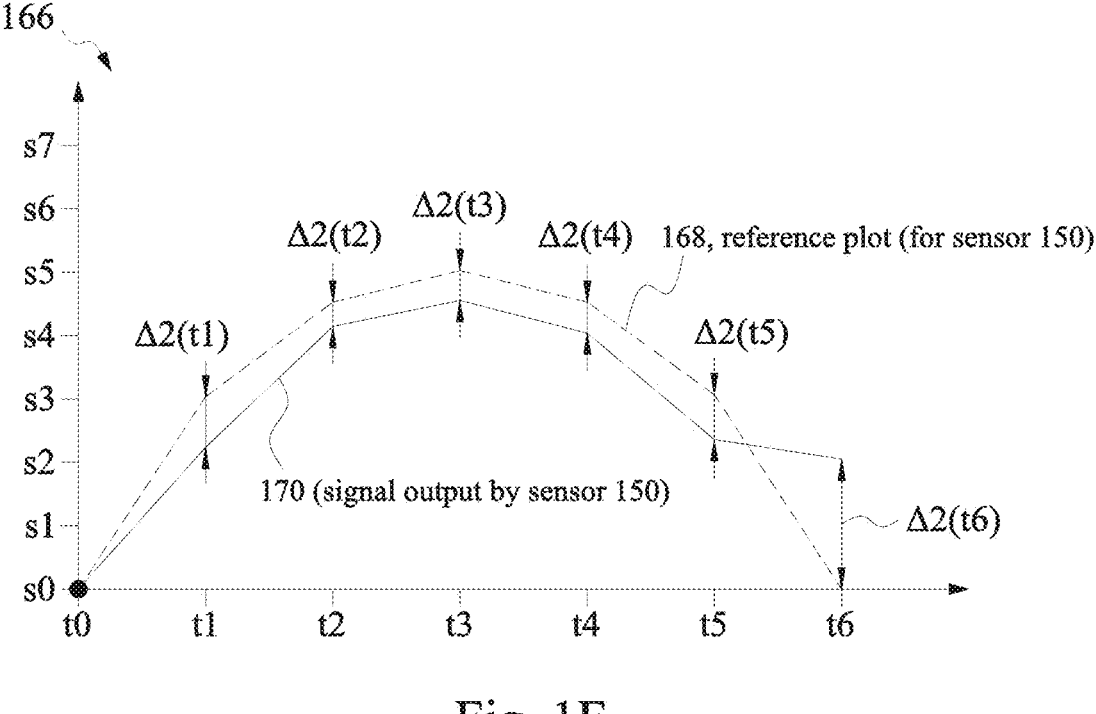

FIGS. 1E-1F are pressure-plots (plots of pressures) 160 and 166 corresponding to first pressure sensor 146 and second pressure sensor 150, in accordance with at least one embodiment of the present disclosure.

For simplicity of illustration, pressure-plots 160 and 166 are hypothetical examples. In FIGS. 1E-1F, the X-axis represents increments of time and the Y-axis represents increments of pressure. For simplicity, FIGS. 1E-1F show a brief range of time, namely times t0-t6. In some embodiments, other ranges of time are contemplated. Also, for simplicity, FIGS. 1E-1F show a range of pressures, namely pressures s0-s7. In some embodiments, other ranges of pressure are contemplated.

Pressure plot 160 includes a line 162 and a line 164. Line 162 is a piecewise function which represents reference (or expected) values for the first pressure signal generated by first pressure sensor 146. Line 164 is a piecewise function which represents sampled (or actual or measured) values for the first pressure signal generated by first pressure sensor 146. In some embodiments, line 162 is continuous. In some embodiments, line 162 is a piecewise continuous function. In some embodiments, line 162 is based on empirical data. In some embodiments, line 162 is based on calculated/modeled data.

Pressure plot 166 includes a line 168 and a line 170. Line 168 is a piecewise function which represents reference (or expected) values for the second pressure signal generated by second pressure sensor 150. Line 170 is a piecewise function which represents sampled (or actual or measured) values for the second pressure signal generated by second pressure sensor 150. In some embodiments, line 168 is continuous. In some embodiments, line 168 is a piecewise continuous function. In some embodiments, line 168 is based on empirical data. In some embodiments, line 168 is based on calculated/modeled data.

To extend the hypothetical examples which pressure plots 160 and 166 represent, at time t0, let main ACV 104 be in the closed position corresponding to the non-actuated state of main ACV 104. As such, at time t0, each of the reference value (on line 162) for the first pressure signal (generated by first pressure sensor 146), the sampled value (on line 164) of the first pressure signal (generated by first pressure sensor 146), the reference value (on line 168) for the second pressure signal (generated by second pressure sensor 150), and the sampled value (on line 170) of the second pressure signal (generated by second pressure sensor 150) has a minimum value, s0. In some embodiments, s0 is zero pressure.

From time to t0 time t3, let controller 156 actuate main ACV 104 by controlling first I/P converter 142 to increase the air pressure provided to first pneumatic port 127A of cylinder 124C. Accordingly, the reference value (on line 162) for the first pressure signal and the corresponding sampled value (on line 164) of the first pressure signal progressively increase over times t1, t2 and t3. As piston 126A is moved away from first pneumatic port 127A toward second pneumatic port 127B, the air in the fluidic connection between second pneumatic port 127B and second pressure sensor 150 will become progressively more compressed such that air pressure will progressively increase. Accordingly, the reference value (on line 168) for the second pressure signal and the corresponding sampled value (on line 170) of the second pressure signal progressively increase at times t1, t2 and t3. At time t3, main ACV 104 is expected to be in the open position corresponding to the actuated state of main ACV 104.

From time t3 to time t6, let controller 156 de-actuate main ACV 104 by controlling first I/P converter 142 to release the air pressure provided to first pneumatic port 127A of cylinder 124C. Accordingly, the reference value (on line 162) for the first pressure signal and the corresponding sampled value (on line 164) of the first pressure signal progressively decrease over times t4, t5 and t6. As piston 126A is moved toward first pneumatic port 127A and away from second pneumatic port 127B, the air in the fluidic connection between second pneumatic port 127B and second pressure sensor 150 will become progressively less compressed such that air pressure will progressively decrease. Accordingly, the reference value (on line 168) for the second pressure signal and the corresponding sampled value (on line 170) of the second pressure signal progressively decrease at times t4, t5 and t6.

At time t6, main ACV 104 is expected (once again) to be in the closed position corresponding to the non-actuated state of main ACV 104. As such, at time t6, each of the reference value (on line 162) for the first pressure signal (generated by first pressure sensor 146), the sampled value (on line 164) of the first pressure signal (generated by first pressure sensor 146), and the reference value (on line 168) for the second pressure signal (generated by second pressure sensor 150) again has the minimum value, s0. For purposes of discussion, it is assumed that the sampled value (on line 170) of the second pressure signal (generated by second pressure sensor 150) does not have the minimum value s0 but instead has the value s2, where s0<s2. A possible explanation for the sampled value (on line 170) of the second pressure signal (generated by second pressure sensor 150) having the value s2 at time t6 is that piston 126A has not been moved sufficiently close to first pneumatic port 127A of cylinder 124C. When piston 126A has not been moved sufficiently close to first pneumatic port 127A, stem 126C will not have forced the pinch-portion of diaphragm 126B into contact with weir 126E (thereby permitting a small flow of liquid to pass from pipe 106 to pipe 110), which represents a failure state of main ACV 104.

In operation, controller 156: receives the first pressure signal from first pressure sensor 146 and generates line 164; and receives the second pressure signal from second pressure sensor 150 and generates line 170. Also, controller 156: receives the first temperature signal from first temperature sensor 144 and adjusts a first threshold value based on the first temperature signal; and receives the second temperature signal from second temperature sensor 148 and adjusts a second threshold value based on the second temperature signal. Details regarding temperature-related adjustments, e.g., in the context of compressibility, are found in U.S. Pat. No. 5,251,148, incorporated above. In some embodiments, controller 156 does not adjust the first and second thresholds based on the corresponding first and second temperature signals. Accordingly, in some embodiments, system 100 does not include first temperature sensor 144 and second temperature sensor 148.

Controller 156 compares measured values on line 164 against corresponding reference values on line 162, determines corresponding first differences $\Delta1(t)$, and compares the first differences $\Delta1(t)$ against the first threshold value. Also, controller 156 compares measured values on line 170 against corresponding reference values on line 168, determines corresponding second differences $\Delta2(t)$, and compares the second differences $\Delta2(t)$ against the second threshold value.

In some embodiments, if either an instance of the first difference $\Delta1(t)$ exceeds the first threshold value or an instance of the second difference $\Delta2(t)$ exceeds the second threshold value, then controller 156 recognizes that main ACV 104 has not fully closed, and main ACV 104 is in a failure state. Returning to the hypothetical examples of pressure plots 160 and 166, it is assumed that the sampled value (on line 170) of the second pressure signal (generated by second pressure sensor 150) at t6 is s2 (line_170(t6)=s2), and that the difference between the sampled value sampled value (line 170) and the reference value (on line 168) at time t6 (line_168(t6)=s0) exceeds the second threshold (thresh2), where $\Delta2(t6)$=line_170(t6)–lin_168(t6)=s2–s0 such that thresh2<$\Delta2(t6)$. Upon determining that main ACV 104 is in a failure state, controller 156 generates the second control signal, which causes the backup ACV 108 to close. In some embodiments, controller 156 also triggers an alarm. Such an alarm notifies a user that main ACV 104 is in the failure state and is in need of repair and/or adjustment.

Figure 2A:
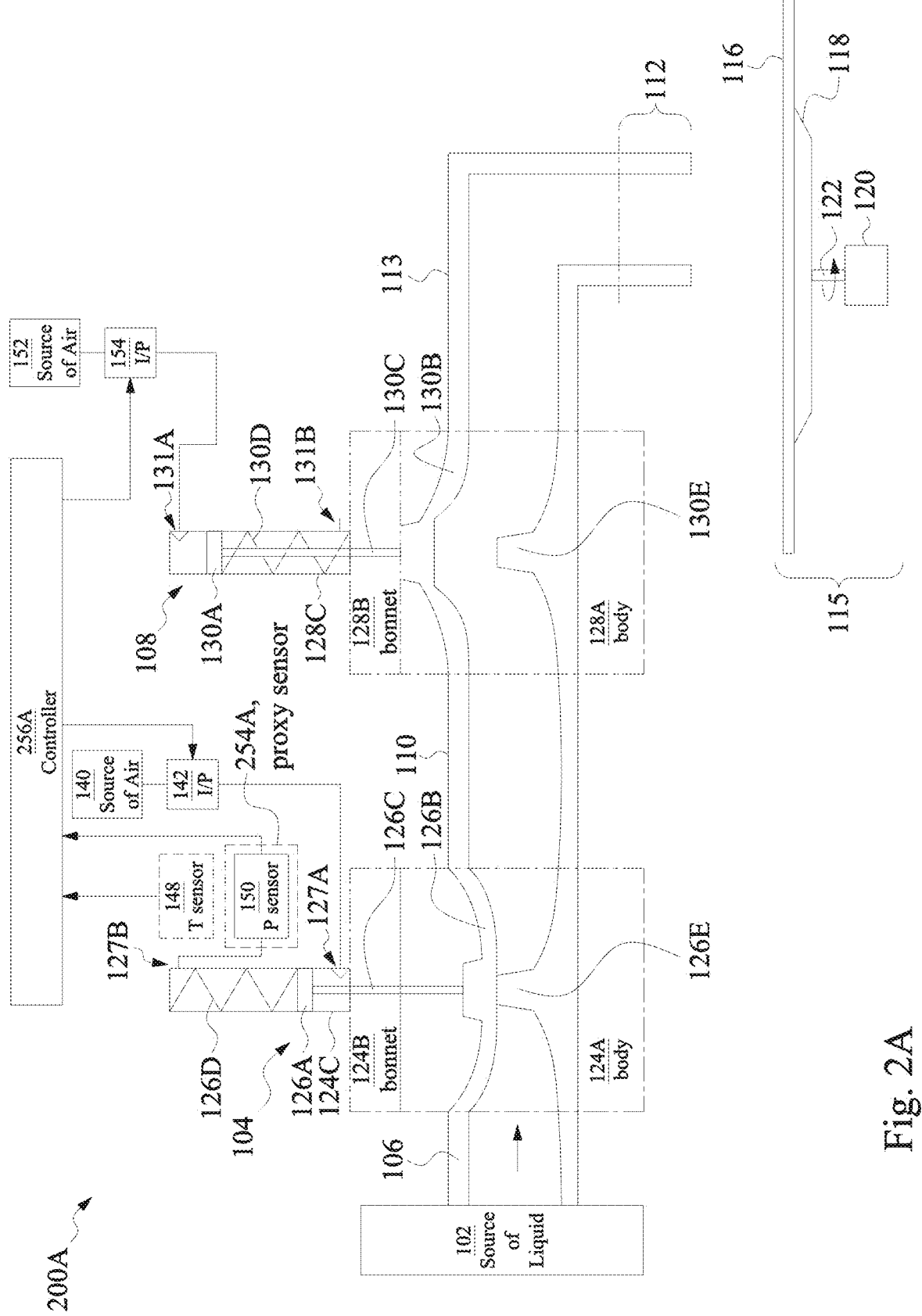
FIG. 2A is a diagram of another drippage prevention system, in accordance with at least one embodiment of the present disclosure.

FIG. 2A is a diagram of a drippage prevention system 200A, in accordance with at least one embodiment of the present disclosure.

In FIG. 2A, system 200A is similar to system 100 where similar albeit different components in system 200A have been assigned a reference number that is increased by 100 relative to corresponding components in system 100. For brevity of description, the discussion will focus on differences in system 200A with respect to system 100.

System 200A differs from system 100 in that system 200A does not include first temperature sensor 144 and first pressure sensor 146. Accordingly, system 200A includes: a proxy sensor 245A instead of proxy sensor 145, where proxy sensor 245A includes second pressure sensor 150; and a controller 256A instead of controller 156. Among other things, controller 256A receives the second temperature signal from second temperature sensor 148 and adjusts the second threshold value based on the second temperature signal. In some embodiments, controller 256A does not adjust the second threshold based on the second temperature signal. Accordingly, in some embodiments, system 200A does not include second temperature sensor 148.

Figure 2B:
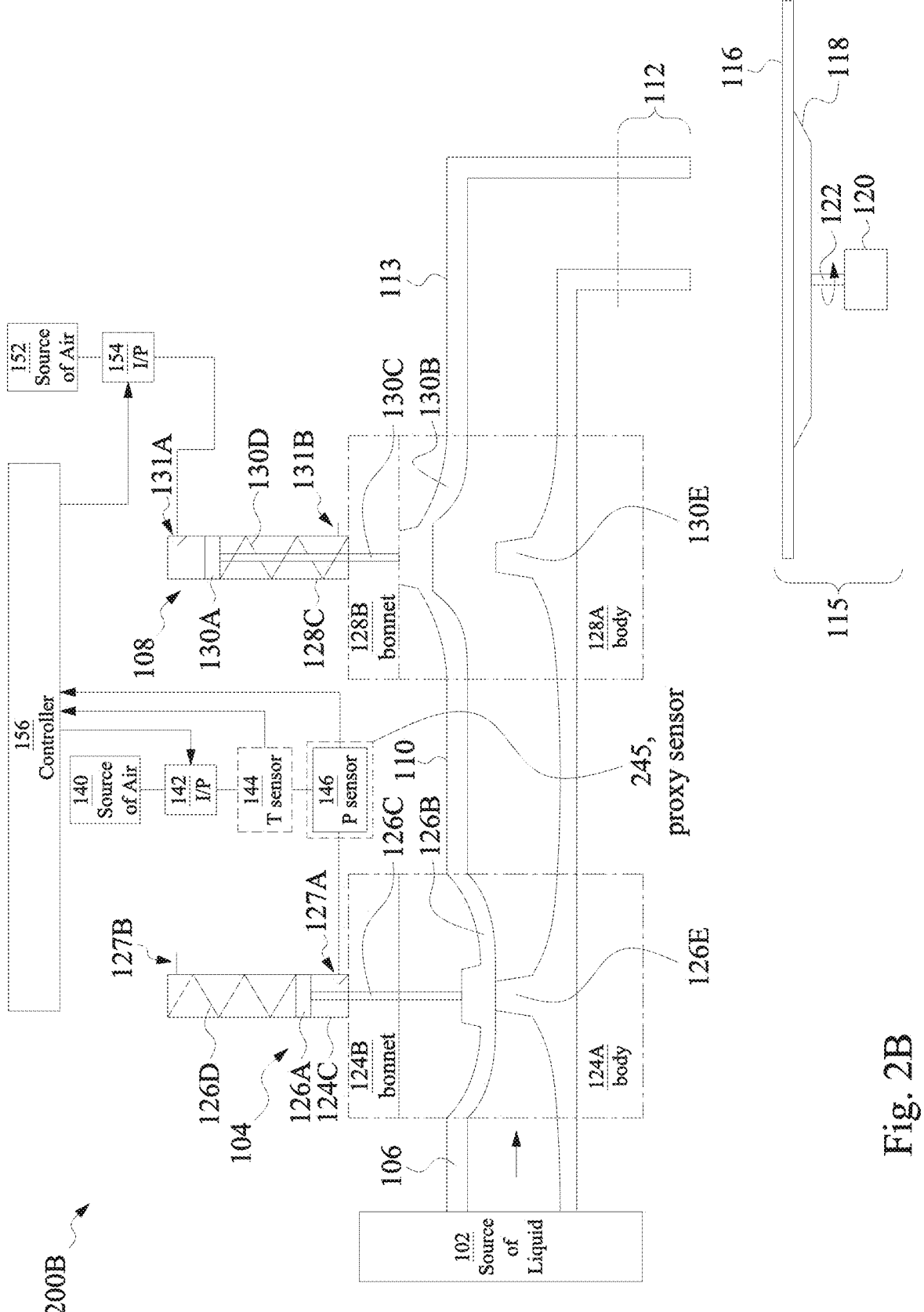
FIG. 2B is a diagram of another drippage prevention system, in accordance with at least one embodiment of the present disclosure.

FIG. 2B is a diagram of a drippage prevention system 200B, in accordance with at least one embodiment of the present disclosure.

In FIG. 2A, system 200B is similar to system 100 where similar albeit different components in system 200B have been assigned a reference number that is increased by 100 relative to corresponding components in system 100. For brevity of description, the discussion will focus on differences in system 200B with respect to system 100.

System 200B differs from system 100 in that system 200A does not include second temperature sensor 148 and second pressure sensor 150. Accordingly, system 200B includes: a proxy sensor 245B instead of proxy sensor 145, where proxy sensor 245B includes first pressure sensor 146; and a controller 256B instead of controller 156. Among other things, controller 256B receives the first second temperature signal from first temperature sensor 144 and adjusts the first threshold value based on the first temperature signal. In some embodiments, controller 256B does not adjust the first threshold based on the first temperature signal. Accordingly, in some embodiments, system 200B does not include first temperature sensor 144.

Figure 3:
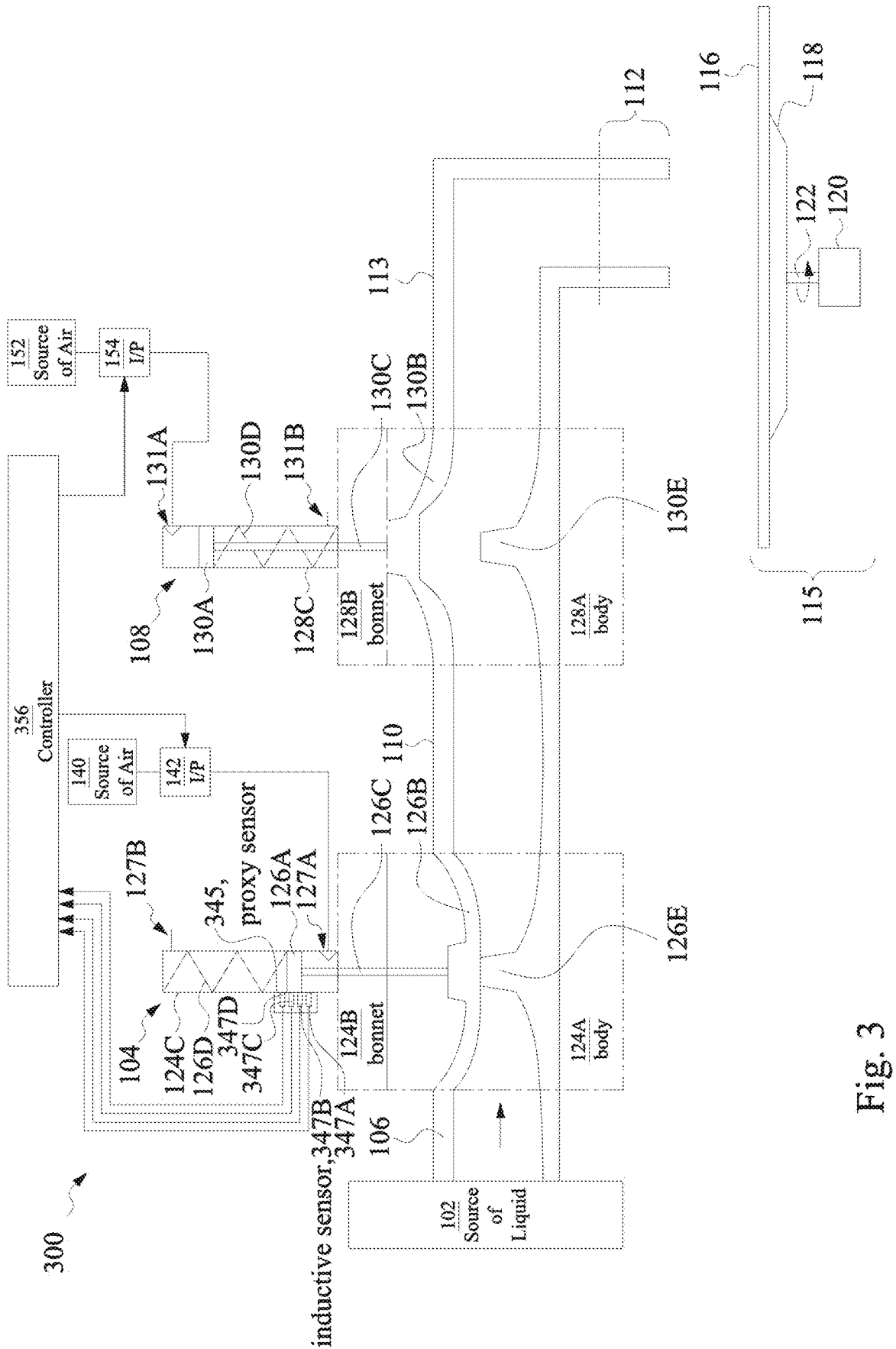
FIG. 3 is a diagram of another drippage prevention system, in accordance with at least one embodiment of the present disclosure.

FIG. 3 is a diagram of a drippage prevention system 300, in accordance with at least one embodiment of the present disclosure.

In FIG. 3, system 300 is similar to system 100 where similar albeit different components in system 300 have been assigned a reference number that is increased by 200 relative to corresponding components in system 100. For brevity of description, the discussion will focus on differences in system 300 with respect to system 100.

System 300 differs from system 100 in that system 300 does not include: first temperature sensor 144; first pressure sensor 146; second temperature sensor 148; and second pressure sensor 150. Accordingly, system 300 includes: a proxy sensor 345 instead of proxy sensor 145; and a controller 356 instead of controller 156. Proxy sensor 345 includes at least one inductive sensor. In FIG. 3, proxy sensor 345 is shown as including a first inductive sensor 347A, a second inductive sensor 347B, a third inductive sensor 347C and a fourth inductive sensor 347D. Each of inductive sensors 347A-347D generates a piston-position signal which varies depending on the position of piston 126A in cylinder 124C. In some embodiments, the signals of inductive sensors 347A-347D exhibit similar variation. For example, when a midline of piston 126A is opposite inductive sensor 347A, the piston-position signal output by inductive sensor 347A peaks. Details regarding inductively sensing position, in general, are found in U.S. Pat. No. 4,719,362, granted Jan. 12, 1988, and U.S. Pat. No. 5,264,733, granted Nov. 23, 1993, the entirety of each of which is hereby incorporated by reference. Among other things, controller 356 receives and compares the piston-position signals of inductive sensors 347A-347D and thereby determines a position of piston 126A relative to inductive sensors 347A-347D.

If controller 356 determines that piston 126A is not in an appropriate position when main ACV 104 is supposed to be in the closed position, then controller 356 determines main ACV 104 to be in a failure state. Upon determining that main ACV 104 is in a failure state, controller 356 generates the second control signal, which causes the backup ACV 108 to close. In some embodiments, controller 356 also triggers the alarm.

Figure 4:
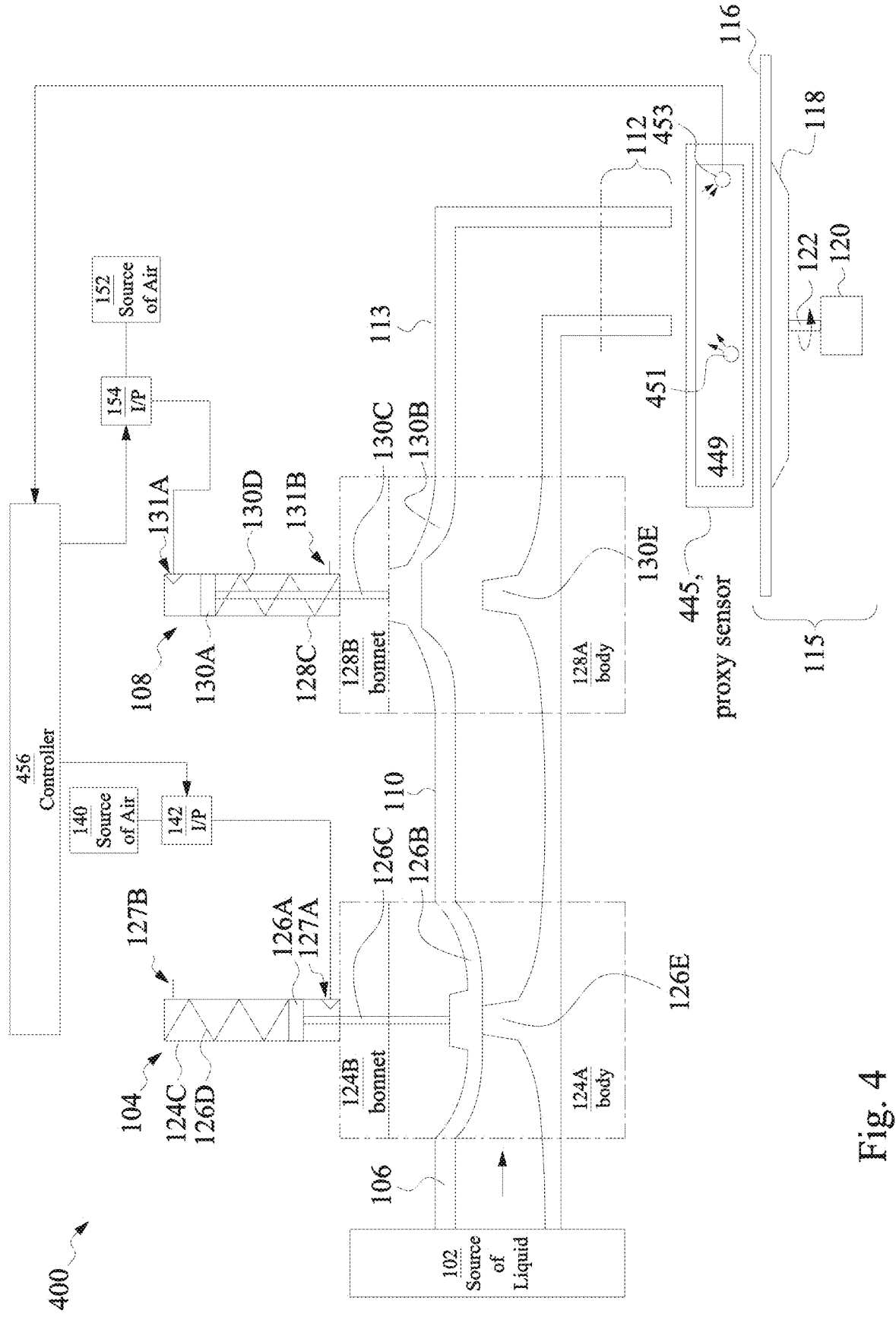
FIG. 4 is a diagram of another drippage prevention system, in accordance with at least one embodiment of the present disclosure.

FIG. 4 is a diagram of a drippage prevention system 400, in accordance with at least one embodiment of the present disclosure.

In FIG. 4, system 400 is similar to system 100 where similar albeit different components in system 400 have been assigned a reference number that is increased by 300 relative to corresponding components in system 100. For brevity of description, the discussion will focus on differences in system 400 with respect to system 100.

System 400 differs from system 100 in that system 400 does not include: first temperature sensor 144; first pressure sensor 146; second temperature sensor 148; and second pressure sensor 150. Accordingly, system 300 includes: a proxy sensor 445 instead of proxy sensor 145; and a controller 456 instead of controller 156. Proxy sensor 445 includes an optical sensing arrangement 449. Optical sensing arrangement 449 includes an optical emitter 451 and an optical receiver 453. Optical sensing arrangement 449 generates a drippage signal which varies according to whether drops 114 (FIG. 1C) are present or not in the space between optical emitter 451 and optical receiver 453. Details regarding an optical drop-sensing arrangement are found in U.S. Pre-Grant Publication No. 20150004720, published Jan. 1, 2015, the entirety of which is hereby incorporated by reference. Among other things, controller 456 receives the signal from proxy sensor 445 (in particular, optical sensing arrangement 449) and thereby determines if drops 114 (FIG. 1C) are present or not.

If controller 456 determines that drops 114 are present at a time when main ACV 104 is supposed to be in the closed position, then controller 456 deems main ACV 104 to be in a failure state. Upon determining that main ACV 104 is in a failure state, controller 456 generates the second control signal, which causes the backup ACV 108 to close. In some embodiments, controller 456 also triggers the alarm.

Figure 5A:
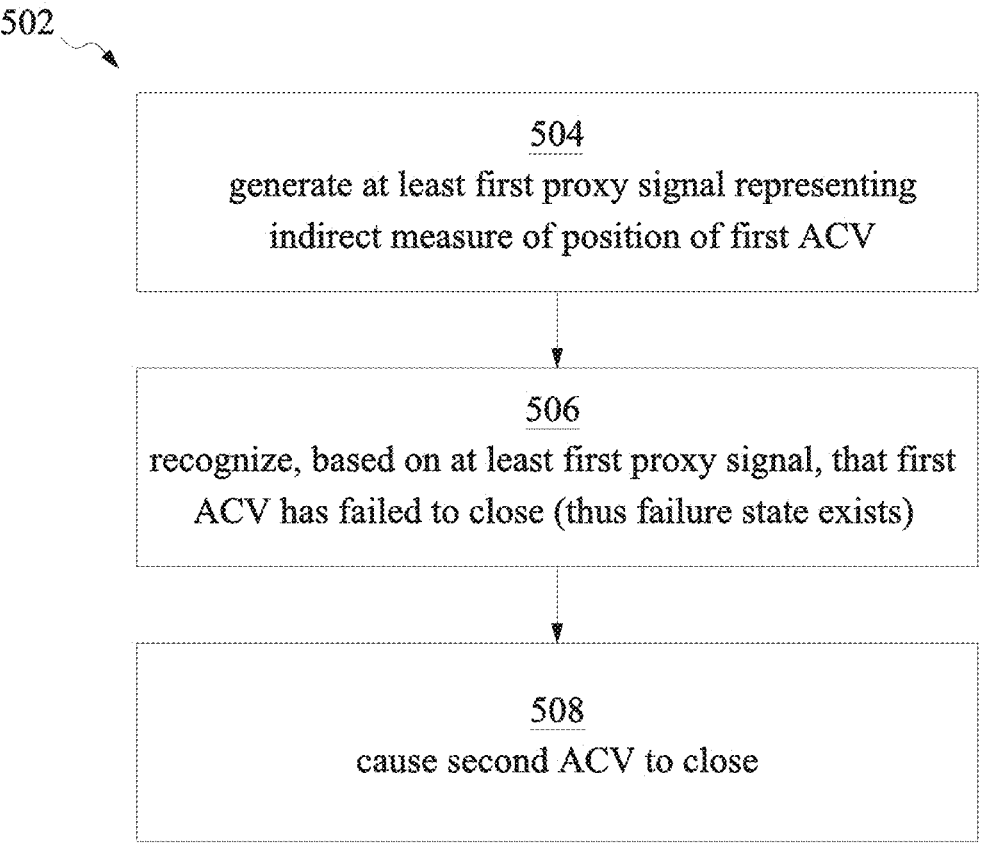
FIG. 5A is a flowchart of a method for operating a drippage prevention system, in accordance with at least one embodiment of the present disclosure.

FIG. 5A is a flowchart 502 of a method of operating a drippage prevention system, and thus is a method of preventing drippage in a fluid dispensing system, in accordance with at least one embodiment of the present disclosure.

In FIG. 5A, flowchart 502 includes a block 504. At block 504, at least a first proxy signal (e.g., the first pressure signal from proxy sensor 146, the second pressure signal from second pressure sensor 150, the signal from proxy sensor 345, the signal from proxy sensor 445, or the like) is generated. The at least first proxy signal represents an indirect measure of the position of a first ACV (e.g., main ACV 104, or the like), the first ACV having a position ranging from a fully closed position to a fully open position. From block 504, flow proceeds to a block 506.

At block 506, based on at least the first proxy signal, it is recognized (e.g., by controller 156, 356, 456 or the like) that the first ACV has failed to close, and thus a failure state exists. From block 506, flow proceeds to a block 508.

At block 508, a second ACV (e.g., backup ACV 108, or the like) is caused to close (e.g., under the control of controller 156, 356, 456 or the like). Like the first ACV, the second ACV has a position ranging from a fully closed position to a fully open position.

Figure 5B:
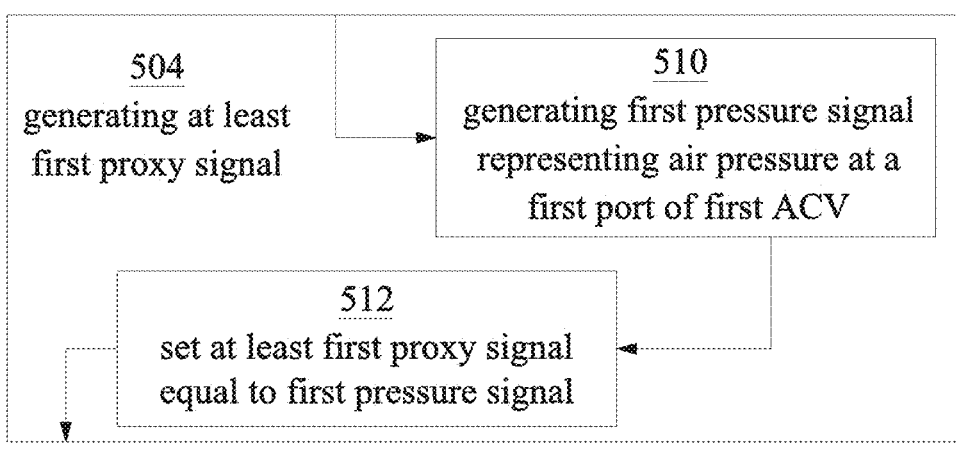
FIG. 5B is a more detailed view of a block in the flowchart of FIG. 5A, in accordance with at least one embodiment of the present disclosure.

FIG. 5B is a more detailed view of block 504 of FIG. 5A, in accordance with at least one embodiment of the present disclosure.

In FIG. 5B, block 504 includes blocks 510-512. At block 510, at least a first pressure signal is generated representing air pressure at a first port (e.g., second port 127B of main ACV 104, or the like) of the first ACV. From block 510, flow proceeds to block 512. At block 512, the first proxy signal is set equal to the first pressure signal.

Figure 5C:
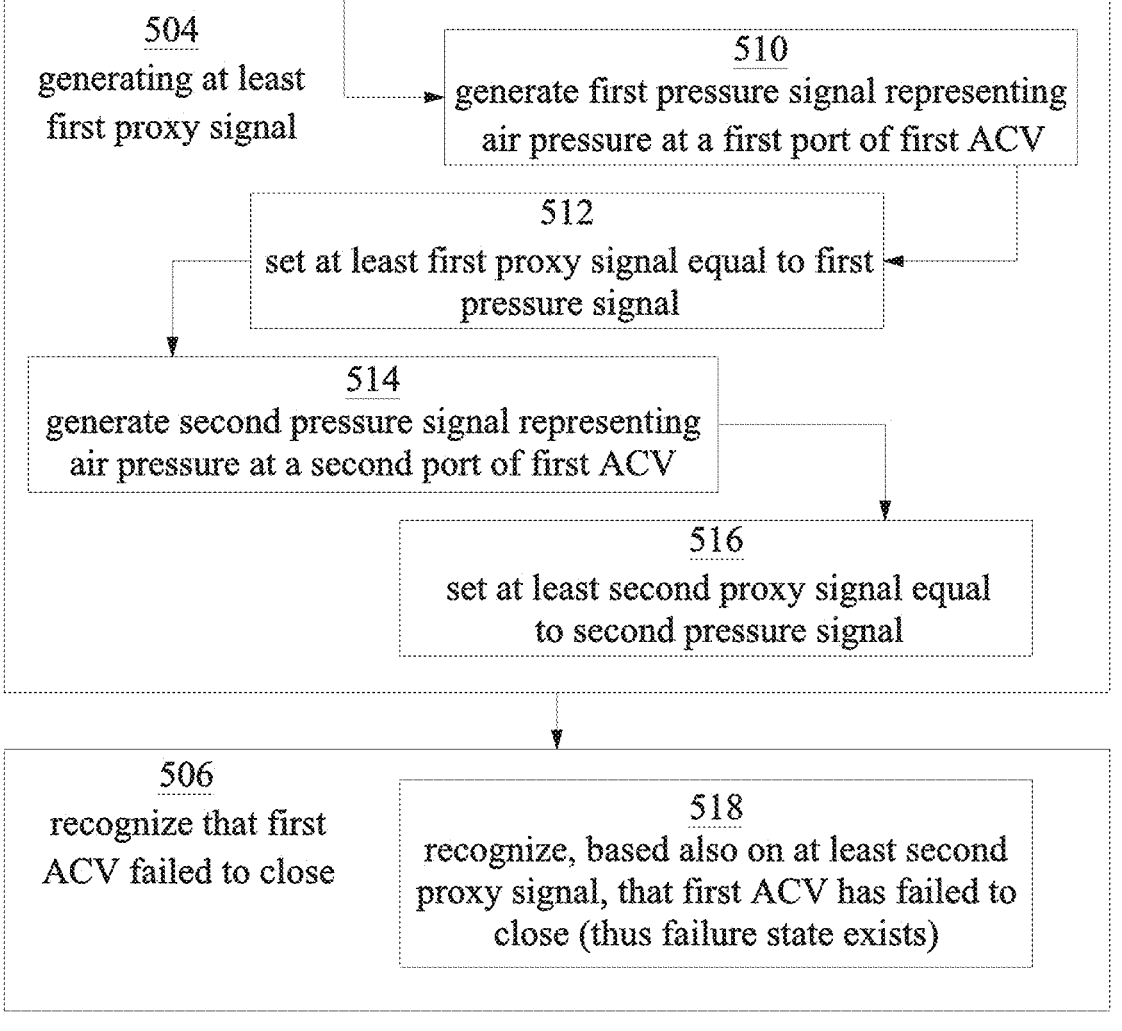
FIG. 5C is a more detailed view of blocks in the flowchart of FIG. 5A, in accordance with at least one embodiment of the present disclosure.

FIG. 5C is a more detailed view of blocks 504 and 506 of FIG. 5A, in accordance with at least one embodiment of the present disclosure.

In FIG. 5B, block 504 includes blocks 510-516. Blocks 510-512 are the same as in FIG. 5B. From block 512, flow proceeds to a block 514. At block 514, at least a second pressure signal is generated representing air pressure at a second port (e.g., first port 127A of main ACV 104, or the like) of the first ACV. From block 514, flow proceeds to block 516. At block 516, the second proxy signal is set equal to the second pressure signal.

As noted, flow proceeds from block 504 to block 506. In FIG. 5B, block 506 includes a block 518. At block 518, based on at least the second proxy signal as well as the first proxy signal, it is recognized (e.g., by controller 156, 356, 456 or the like) that the first ACV has failed to close, and thus a failure state exists.

Figure 5D:
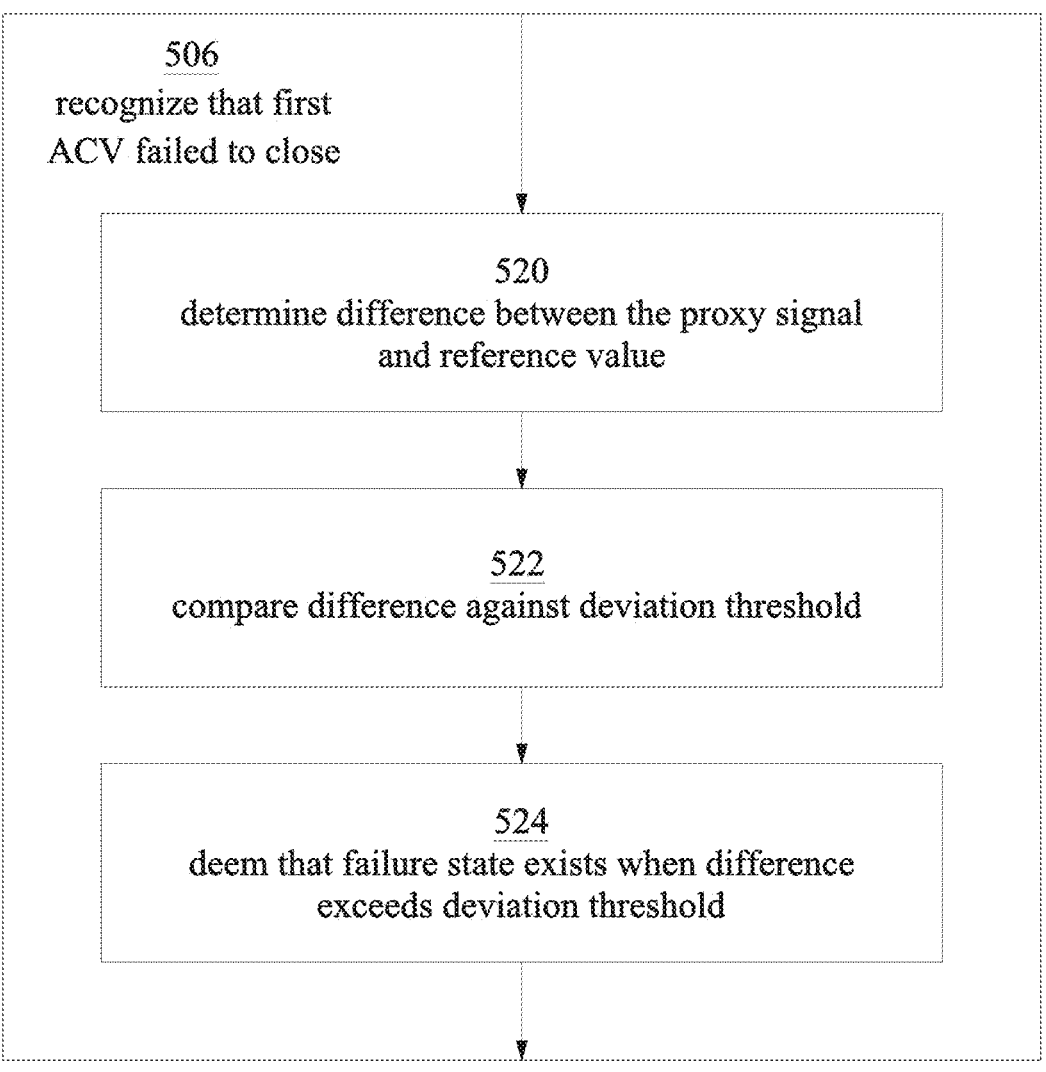
FIG. 5D is a more detailed view of another block in the flowchart of FIG. 5A, in accordance with at least one embodiment of the present disclosure.

FIG. 5D is a more detailed view of block 506 of FIG. 5A, in accordance with at least one embodiment of the present disclosure.

In FIG. 5D, block 506 includes blocks 520-524. Blocks 520-524 are executed, e.g., by controller 156, 356, 456 or the like. At block 520, a difference between the proxy signal and a corresponding reference value is determined. From block 520, flow proceeds to block 522. At block 522, the difference is compared against a deviation threshold. From block 522, flow proceeds to block 524. At block 524, when the difference exceeds the deviation threshold, it is determined that the failure state exists.

One of ordinary skill in the art would recognize that operations are able to be removed or that additional operations are able to be added to at least one of the above-noted methods without departing from the scope of this description. One of ordinary skill in the art would also recognize that an order of operations in at least one of the above-noted methods is able to be adjusted without departing from the scope of this description.

Figure 6:
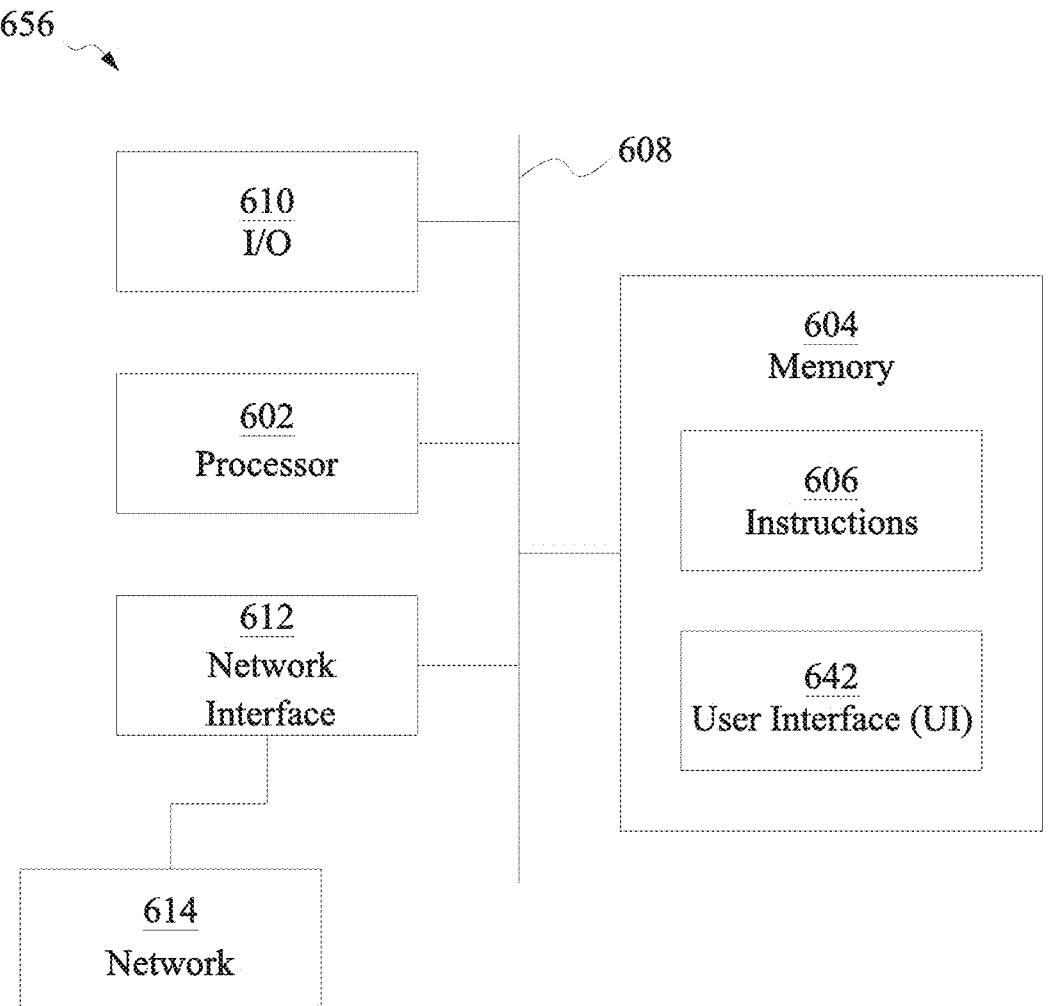
FIG. 6 is a block diagram of a general purpose computing device for implementing the controller, accordance with one or more embodiments.

FIG. 6 is a block diagram of a controller 656, in accordance with some embodiments. Controllers 156, 256A, 256B, 356, 456 or the like are implemented, for example, using controller 656.

In some embodiments, controller 656 is a general purpose computing device including a hardware processor 602 and a non-transitory, computer-readable storage medium 604. Storage medium 604, amongst other things, is encoded with, i.e., stores, computer program code 606, i.e., a set of executable instructions. Execution of instructions 606 by hardware processor 602 represents (at least in part) a controller which implements a portion or all of, e.g., the method of preventing drippage in a fluid dispensing system, the methods of FIGS. 5A-6D, in accordance with one or more embodiments (hereinafter, the methods).

Processor 602 is electrically coupled to computer-readable storage medium 604 via a bus 608. Processor 602 is also electrically coupled to an I/O interface 610 by bus 608. A network interface 612 is also electrically connected to processor 602 via bus 608. Network interface 612 is connected to a network 614, so that processor 602 and computer-readable storage medium 604 are capable of connecting to external elements via network 614. Processor 602 is configured to execute computer program code 606 encoded in computer-readable storage medium 604 in order to cause system 600 to be usable for performing a portion or all of the noted methods. In one or more embodiments, processor 602 is a central processing unit (CPU), a multi-processor, a distributed processing system, an application specific integrated circuit (ASIC), and/or a suitable processing unit.

In one or more embodiments, computer-readable storage medium 604 is an electronic, magnetic, optical, electromagnetic, infrared, and/or a semiconductor system (or apparatus or device). For example, computer-readable storage medium 604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 604 includes a compact disk-read only memory (CD-ROM), a compact disk-read/write (CD-R/W), and/or a digital video disc (DVD).

In one or more embodiments, storage medium 604 stores computer program code 606 configured to cause controller 656 (where such execution represents (at least in part) the controller) to be usable for performing a portion or all of the methods. In one or more embodiments, storage medium 604 also stores information which facilitates performing a portion or all of the methods.

Controller 656 includes I/O interface 610. I/O interface 610 is coupled to external circuitry. In one or more embodiments, I/O interface 620 includes a keyboard, keypad, mouse, trackball, trackpad, touchscreen, and/or cursor direction keys for communicating information and commands to processor 602.

Controller 656 also includes network interface 612 coupled to processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interfaces such as ETHERNET, USB, or IEEE-1364. In one or more embodiments, a portion or all of methods is/are implemented in two or more systems 600.

System 600 is configured to receive information through I/O interface 610. The information received through I/O interface 610 includes one or more of instructions, data, design rules, libraries of standard cells, and/or other parameters for processing by processor 602. The information is transferred to processor 602 via bus 608. Controller 656 is configured to receive information related to a UI through I/O interface 610. The information is stored in computer-readable medium 604 as user interface (UI) 642.

In some embodiments, a portion or all of the noted methods is implemented as a standalone software application for execution by a processor. In some embodiments, a portion or all of the noted methods is implemented as a software application that is a part of an additional software application. In some embodiments, a portion or all of the methods is implemented as a plug-in to a software application. In some embodiments, at least one of the methods is implemented as a software application that is a portion of an EDA tool. In some embodiments, a portion or all of the methods is implemented as a software application that is used by controller 656.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

An aspect of this description relates to a method of preventing drippage in a liquid dispensing system. The method includes generating at least a first proxy signal representing at least a first indirect measure of a position of a first automatic control valve (ACV), wherein the first ACV has positions ranging from fully closed to fully open. The method further includes recognizing, based on at least the first proxy signal, whether a failure state exists in which the first ACV has failed to close. The method further includes causing a second ACV to close when the failure state exists, wherein the second ACV is fluidically connected to the first ACV, and the second ACV has positions ranging from fully closed to fully open. In some embodiments, the method further includes maintaining the second ACV in an open state in response to the failure state not existing. In some embodiments, generating the first proxy signal includes generating the first proxy signal based on a first pressure signal at a first port of the first ACV. In some embodiments, causing the second ACV to close includes using pneumatic control to cause the second ACV to close. In some embodiments, generating the first proxy signal includes generating the first proxy signal based on a temperature of the first ACV. In some embodiments, generating the first proxy signal includes generating the first proxy signal based on a determination of whether liquid is dispensed from a nozzle. In some embodiments, causing the second ACV to close includes closing the second ACV downstream from the first ACV. In some embodiments, the method further includes biasing the first ACV to a close position. In some embodiments, the method further includes biasing the second ACV to close.

An aspect of this description relates to a drippage prevention system including a first automatic control valve (ACV) configured to control a flow of a fluid toward a downstream nozzle. The system further includes a second ACV downstream of the first ACV, wherein the second ACV is configured to control the flow of the fluid toward the downstream nozzle. The system further includes a sensor configured to generate a proxy signal representing an indirect measure of a position of the first ACV. The system further includes a controller electrically connected to the second ACV and the sensor, wherein the controller is configured to cause the second ACV to fully close in response to detection of a failure state based on the proxy signal. In some embodiments, the system further includes the nozzle downstream of the second ACV. In some embodiments, the sensor includes a pressure sensor. In some embodiments, the sensor includes a temperature sensor. In some embodiments, the first ACV includes a biasing element configured to bias the first ACV to a closed position.

An aspect of this description relates to a method of manufacturing a semiconductor device. The method includes placing a wafer on a table. The method further includes dispensing a fluid from a nozzle onto the wafer. The method further includes generating at least a first proxy signal representing at least a first indirect measure of a position of a first automatic control valve (ACV), wherein the first ACV has positions ranging from fully closed to fully open. The method further includes recognizing, based on at least the first proxy signal, whether a failure state exists in which the first ACV has failed to close. The method further includes causing a second ACV to close when the failure state exists, wherein the second ACV is fluidically connected to the first ACV, the second ACV has positions ranging from fully closed to fully open, and causing the second ACV to close ceases the dispensing of the fluid onto the wafer. In some embodiments, the method further includes rotating the wafer. In some embodiments, the method further includes moving the nozzle relative to the wafer. In some embodiments, generating the first proxy signal includes generating the first proxy signal based on a first pressure signal at a first port of the first ACV. In some embodiments, generating the first proxy signal includes generating the first proxy signal based on a temperature of the first ACV. In some embodiments, generating the first proxy signal includes generating the first proxy signal based on a determination of whether liquid is dispensed from a nozzle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of preventing drippage in a liquid dispensing system, the method comprising:
   generating at least a first proxy signal representing at least a first indirect measure of a position of a first automatic control valve (ACV), wherein the first ACV has positions ranging from fully closed to fully open,
   recognizing, based on at least the first proxy signal, whether a failure state exists in which the first ACV has failed to close; and
   causing a second ACV to close when the failure state exists, wherein the second ACV is fluidically connected to the first ACV, and the second ACV has positions ranging from fully closed to fully open.

2. The method of claim 1, further comprising maintaining the second ACV in an open state in response to the failure state not existing.

3. The method of claim 1, wherein generating the first proxy signal comprises generating the first proxy signal based on a first pressure signal at a first port of the first ACV.

4. The method of claim 1, wherein causing the second ACV to close comprises using pneumatic control to cause the second ACV to close.

5. The method of claim 1, wherein generating the first proxy signal comprises generating the first proxy signal based on a temperature of the first ACV.

6. The method of claim 1, wherein generating the first proxy signal comprises generating the first proxy signal based on a determination of whether liquid is dispensed from a nozzle.

7. The method of claim 1, wherein causing the second ACV to close comprises closing the second ACV downstream from the first ACV.

8. The method of claim 1, further comprising biasing the first ACV to a close position.

9. The method of claim 1, further comprising biasing the second ACV to close.

10. A drippage prevention system comprising:
   a first automatic control valve (ACV) configured to control a flow of a fluid toward a downstream nozzle;

a second ACV downstream of the first ACV, wherein the second ACV is configured to control the flow of the fluid toward the downstream nozzle;

a sensor configured to generate a proxy signal representing an indirect measure of a position of the first ACV; and a controller electrically connected to the second ACV and the sensor, wherein the controller is configured to cause the second ACV to fully close in response to detection of a failure state based on the proxy signal.

11. The drippage prevention system of claim 10, further comprising the nozzle downstream of the second ACV.

12. The drippage prevention system of claim 10, wherein the sensor comprises a pressure sensor.

13. The drippage prevention system of claim 10, wherein the sensor comprises a temperature sensor.

14. The drippage prevention system of claim 10, wherein the first ACV comprises a biasing element configured to bias the first ACV to a closed position.

15. A method of manufacturing a semiconductor device, the method comprising:

placing a wafer on a table;

dispensing a fluid from a nozzle onto the wafer;

generating at least a first proxy signal representing at least a first indirect measure of a position of a first automatic control valve (ACV), wherein the first ACV has positions ranging from fully closed to fully open, recognizing, based on at least the first proxy signal, whether a failure state exists in which the first ACV has failed to close; and causing a second ACV to close when the failure state exists, wherein the second ACV is fluidically connected to the first ACV, the second ACV has positions ranging from fully closed to fully open, and causing the second ACV to close ceases the dispensing of the fluid onto the wafer.

16. The method of claim 15, further comprising rotating the wafer.

17. The method of claim 15, further comprising moving the nozzle relative to the wafer.

18. The method of claim 15, wherein generating the first proxy signal comprises generating the first proxy signal based on a first pressure signal at a first port of the first ACV.

19. The method of claim 15, wherein generating the first proxy signal comprises generating the first proxy signal based on a temperature of the first ACV.

20. The method of claim 15, wherein generating the first proxy signal comprises generating the first proxy signal based on a determination of whether liquid is dispensed from the nozzle.

* * * * *